US012628482B2

(12) United States Patent
Arutinov et al.

(10) Patent No.: US 12,628,482 B2
(45) Date of Patent: May 12, 2026

(54) MULTI-LAYER RELEASE STACK FOR LIGHT INDUCED TRANSFER OF COMPONENTS

(71) Applicant: Nederlandse Organisatie voor toegepast-natuurwetenschappelijk onderzoek TNO, 's-Gravenhage (NL)

(72) Inventors: Gari Arutinov, Helmond (NL); Rob Jacob Hendriks, Helmond (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 83 days.

(21) Appl. No.: 18/842,833

(22) PCT Filed: Sep. 6, 2022

(86) PCT No.: PCT/NL2022/050502
§ 371 (c)(1),
(2) Date: Aug. 30, 2024

(87) PCT Pub. No.: WO2023/167582
PCT Pub. Date: Sep. 7, 2023

(65) Prior Publication Data
US 2025/0204119 A1      Jun. 19, 2025

(51) Int. Cl.
H10H 29/03       (2025.01)
H10P 56/00       (2026.01)

(52) U.S. Cl.
CPC ............. H10H 29/03 (2025.01); H10P 56/00 (2026.01)

(58) Field of Classification Search
None
See application file for complete search history.

(56) References Cited

U.S. PATENT DOCUMENTS

| | | | |
|---|---|---|---|
| 5,893,873 | A | 4/1999 | Rader et al. |
| 2013/0285086 | A1 | 10/2013 | Hu et al. |

(Continued)

FOREIGN PATENT DOCUMENTS

| | | |
|---|---|---|
| EP | 3742477 A1 | 11/2020 |
| WO | 2017075776 A1 | 5/2017 |

OTHER PUBLICATIONS

International Search Report and Written Opinion—PCT/NL2022/050502—mailing date Sep. 7, 2023.

*Primary Examiner* — Barbara J Musser
(74) *Attorney, Agent, or Firm* — Banner & Witcoff, Ltd.

(57)           ABSTRACT

A method and system for light induced transfer of components (15) from a donor substrate (10) to an acceptor substrate (20). The donor substrate (10) comprises a transparent carrier (11) configured to carry the components (15) facing the acceptor substrate (20), and a release stack (S). The release stack (S) comprises a light-absorbing layer (12), a decomposition layer (16), a melt layer (13), and an adhesive layer (14). The light-absorbing layer (12) has a high absorption coefficient for absorbing the light beam (L) causing heat conduction to the melt layer (13). The light-absorbing layer (12) remains solid while the melt layer (13) is melted. The adhesive layer (14) adheres the components (15) to the melt layer (13) while the melt layer (13) is solid and releases adhesion when the melt layer (13) is melted (M). The decomposition layer (16) has an evaporation temperature above the melting temperature of the melt layer, and forms a bubble (17) stimulating the release and transfer when the melt layer 913) is liquid.

18 Claims, 6 Drawing Sheets

(56)         References Cited

U.S. PATENT DOCUMENTS

| 2017/0100114 | A1 | 4/2017  | Scheller et al. |
| 2017/0313044 | A1 | 11/2017 | Marinov et al.  |
| 2019/0051630 | A1 | 2/2019  | Bayless et al.  |
| 2020/0168498 | A1 | 5/2020  | Marinov et al.  |
| 2021/0059702 | A1 | 3/2021  | Abt et al.      |

MULTI-LAYER RELEASE STACK FOR LIGHT INDUCED TRANSFER OF COMPONENTS

CROSS-REFERENCE TO RELATED APPLICATIONS

This application is a U.S. National Stage application under 35 U.S.C. § 371 of International Application PCT/NL2022/050502 (published as WO 2023/167582 A1), filed Sep. 6, 2022, which claims the benefit of priority to Application PCT/NL2022/050114, filed Mar. 1, 2022. Benefit of the filing date of these prior applications is hereby claimed. Each of these prior applications is hereby incorporated by reference in its entirety.

TECHNICAL FIELD AND BACKGROUND

The present disclosure relates to methods and systems for light induced transfer of components such as chips from a donor substrate to an acceptor substrate. The disclosure also relates to a donor substrate for use in such method or system.

Controlled transfer of small components has various applications, e.g. in the placement of µLEDs. Light induced transfer can be used to selectively transfer components from a donor substrate to an acceptor substrate. To facilitate the transfer, a release stack can be provided between the donor substrate and the components. In one technique components are glued onto a carrier substrate, and released from the carrier due to rapid blister formation. In another technique a flat glass plate with a light absorbing layer is coated with a glue. The components can be released due to decomposition or melting of the glue when the light absorbing layer rapidly heats up by the light pulse.

For each of the known methods, a trade-off is to be made between efficiency (i.e. speed), yield and level of control. None of these methods provide the desired level of control of the transfer process. The faster techniques provide lower yields There remains a need for further improvement in the controlled transfer and placement of components.

SUMMARY

Some aspects of the present disclosure relate to methods and systems for light induced transfer of components from a donor substrate to an acceptor substrate. Other or further aspects relate to the donor substrate for use in such methods or systems. Typically a transparent carrier is configured to carry the components facing the acceptor substrate, and a release stack is disposed between the transparent carrier and the components for releasing one or more of the components from the donor substrate onto the acceptor substrate following illumination of the release stack by a light beam through the transparent carrier.

As described herein the release stack of the donor substrate comprises a light-absorbing layer, a decomposition layer, a melt layer, and an adhesive layer. The light-absorbing layer is disposed between the transparent carrier and the decomposition layer. By providing the light-absorbing layer with a relatively high absorption coefficient the light beam can be efficiently absorbed thereby causing the light-absorbing layer to be heated. By providing the heated light-absorbing layer in thermal contact with the melt layer via the decomposition layer, the absorbed heat can be conducted through the decomposition layer to the melt layer so the temperatures of the decomposition layer and the melt layer can rise. By providing the material of the melt layer with a relatively low melting temperature, this material can be easily melted. By providing the light-absorbing layer with a relatively high melting temperature (at least higher than the melting temperature of the melt layer), the light-absorbing layer can remain solid while the melt layer is melted by the heat conducted from the light-absorbing layer. By providing the adhesive layer between the components and the melt layer, the components can be easily adhered to the melt layer while the melt layer is solid. Furthermore, this adhesion can be released when the melt layer is melted. By providing the decomposition layer with an evaporation temperature in between the melting temperature of the melting layer and the melting temperature of the light-absorbing layer, the material of the decomposition layer will start to evaporate after melting of the melting layer. Within the decomposition layer, bubbles formation raises the pressure in the layer, which results in the decomposition layer to develop a convex shape underneath the molten melt layer. This stimulates release of the component by increasing the contact angle with the adhesive layer at a right moment. The release of the component is thereby accelerated over a situation wherein no decomposition layer would have been present. As a result, the total heat transfer to the component is limited due to the acceleration of the release, which in turn counteracts potential loss of components due to thermal damage. Furthermore, by segmenting at least the adhesive layer between the components, the components can be more easily transferred. For example, shear forces during transfer can be alleviated if part of the adhesive layer can be released together with the component without being connected to surrounding parts of the adhesive layer, e.g. holding adjacent (non-transferred) components or other parts of the adhesive layer. By segmenting the decomposition layer, the bubble formation and thereby the change of curvature into a convex surface is confined to only the area underneath the component (or even a smaller sub-area thereof, if desired). Also the melt layer and/or light-absorbing layer can be segmented to provide further advantages, e.g. further separation and/or isolation of heat to the respective stack. While the segmentation has particular advantages, the components may in principle also be released without requiring segmentation. For example, part of a (continuous) adhesive layer which holds the component may be relatively fragile and simply break from the surrounding adhesive layer when the melt layer between the component and light-absorbing layer is locally melted and the adhesion is diminished. For example, the component can be pulled, pushed, or otherwise released from the carrier by various forces such as gravity and/or de-wetting or accumulating of the melted material with optional gas generation.

Typically, an area of the light-absorbing layer (e.g. forming a part of the release stack holding a respective component), is illuminated with a light beam through the transparent carrier. This can result in heating a respective part of the light-absorbing layer. The heat can then be conducted to an adjacent melt layer of the release stack thereby at least partially melting the adjacent melt layer, preferably while the respective part of the light-absorbing layer remains substantially solid. Accordingly the at least partial melting of the adjacent melt layer can cause a loss of adhesion between the adjacent melt layer and a respective part of the adhesive layer of the release stack (adhering the respective components to the adjacent melt layer). So the loss of adhesion can cause release and transfer of the respective component. For example, one or more light sources and/or masks are configured and controlled to generate one or more light beams for transferring respective components as described herein.

In some embodiments, apart from the decomposition layer providing its function through bubble formation resulting in pressure build-up in the layer, a low gas generation melting layer and adhesive layer in the laser release stack is used to rapidly transfer components from a carrier towards an acceptor substrate. Due to low pressure build-up the components can transfer at low velocity (with minimal or no shockwave) and because there is less turbulent air (gas) around, the component may be substantially prevented from rotating while being transferred. It is noted therein that the bubbles formed in the decomposition layer are confined to the layer in the stack with little or no outgassing. In one embodiment, the stack comprises or essentially consists of a thermally stable light-absorbing layer, melt layer and an adhesive layer. Preferably, the melt layer is a metal layer with a relatively low melting temperature. More preferably, the light-absorbing is also a metal layer but with a relatively high melting temperature. More preferably, the decomposition layer is likewise a metal layer having its evaporation temperature between the melting temperatures of the melting layer and the light-absorbing layer. The invention is not limited to a metallic decomposition layer, and other materials or alloys may be applied having the suitable characteristics. Most preferably the adhesive layer essentially consists of a polymeric adhesive with a decomposition temperature that is higher than and/or closely matched with the melting temperature of the metal melt layer. As a further advantageous (but non-essential) preference, the decomposition layer has a melting temperature that is likewise above the melting temperature of the melting layer, such that melting first starts in the melting layer.

In some embodiments, a laser beam or other light source rapidly heats up the light-absorbing layer sufficiently, such that the underlaying metal layer starts melting. While in molten state, the polymeric adhesive which bonds the component to the metal melt layer may release, e.g. due to de-wetting effects. As the surface tension of liquid metal is typically much higher than the surface energy of solid polymers, the adhesion can be released between the two layers. In contrast, because the surface energy of a solid metal layer is typically very high, the metal melt layer can stick to the metallic decomposition layer provided the melting temperature thereof is above that of the melting layer (as mentioned above). As a result, the metal of the molten melting layer will favour the metal of the (typically still solid) decomposition layer and due to de-wetting the adhesive layer will release. This process is accelerated when the temperature of the decomposition layer rises above its evaporation temperature, and a bubble is formed by gas production in the decomposition layer underneath the melting layer. This will result in an increase of curvature of the surface of the decomposition layer (becoming convex) and the liquid melting layer thereon, thereby stimulating release of the adhesive early. For example, only the polymeric part is transferred together with the component. After transfer, the polymeric layer can be removed from the component, e.g. through dry etching or thermal decomposition In some embodiments, to increase the transfer velocity of the component, the polymeric adhesive can be tuned to decompose slightly at the melting point of the melt layer. During melting, the contact area between the adhesive and melt layer can be reduced, e.g. because of the high surface tension of molten metal. So the material may tend to ball up. Even though the evaporation (decomposition) temperature of a polymeric material such as SU-8 is around 350° C. at low heating rates, at very high heating rates decomposition of polymers tends to occur at much higher temperatures. Choosing a polymer/metal combination where the polymer has a higher decomposition temperature as the melting temperature of the metal (e.g. Sn+SU8, Zn+polyimide) can make it possible to release the components without any gas generation. Advantageously, the evaporation temperature of the decomposition layer is chosen such that bubble formation and the forming of a convex surface occurs while the contact area between the melting layer and the adhesive layer is reduced in this process, in order to trigger release at that moment. Furthermore, for example, gravitational forces or electrostatic forces can be used to release the component from the carrier and transfer towards the acceptor substrate. Typically, it is preferred to stay below the boiling point (evaporation temperature) of the metal melt material. Otherwise the evaporated metal may cause additional pressure and deposit on colder surrounding surfaces.

Besides controlling the amount of gas generation, it is also preferred to heat the light absorbing layer as homogeneous as possible to ensure the metal melt layer melts at the same time. In some embodiments, a flat top beam profile is used that specifically heats the stack above one component and does not interfere with any adjacent components. As it is also preferred to have very narrow dicing streets between the components (e.g. ≤5 µm) to reduce the amount of substrate waste, it may be increasingly difficult to selectively heat a single component. Especially when increasing the transfer speed, timing jitter on the laser may be more difficult to control. Hence it is preferred to use a mask that is precisely aligned with the components and trim the laser pulse to the right dimensions.

As typically only a fraction of the components need to be transferred (e.g. for µLED displays), the laser pulse can be (much) larger than the component. For example, a relatively large flat top beam in combination with a mask can result in a robust process that doesn't require accurate and expensive laser positioning control systems. For example, a maximum laser spot size can be calculated as twice the component pitch minus component size minus laser accuracy. For example: 2×200 µm (component pitch)−40 µm (component size)−10 µm (laser accuracy)=350 µm. At these large spot sizes, it can be relatively easy to obtain a homogeneous heat flux in the middle, especially with beam shaping optics such as a πShaper.

To reduce the heat affected zone and further limit the amount of gas generation, in some embodiments the size of the metal melt layer underneath the component is reduced. For example, to automatically centre the metal melt layer under the component, the layer can be under-etched in an etching bath. The more centralized the component is released, the better the transfer process.

Other or further improvement can come from strategic transfer of components to ensure they are propelled straight towards the acceptor substrate. For example, in case there is any gas generation under the component, typically this gas will escape easiest where there is the lowest flow resistance. Even with an almost perfectly homogenous heat flux, inhomogeneous pressures around the component may lead to undesirable component trajectories, e.g. rotating of the components during transfer. To alleviate this problem, for example a checkers board approach can be used wherein the components are transferred in an alternative manner. By making sure the components to be transferred are either surrounded or not surrounded on opposite sides by adjacent components, the pressure build-up around the transferred component can be more homogenous. When the trajectory of the component can be better controlled in a straight down direction, larger transfer gaps can be realized which may be beneficial for industrialization as height positioning does not need to be very precise.

To improve performance, for example heat flux and fluence can be controlled. Preferably, the light-absorbing layer heats up without going to its melting or evaporation temperature. Furthermore, the high intensity light preferably does not reach the component to prevent damage. With respect to the layer thickness of the metal melt layer, the thicker the layer, the higher the fluence needs to be to melt the entire layer. Furthermore, there is a chance that metals of different layers diffuse and form an alloy. If there is relatively too much molten metal, the light-absorbing layer may completely diffuse into the molten pool. If the light-absorbing layer melts, inhomogeneity effect may occur. To control the melting time, the pulse time and fluence can be controlled. Preferably the pulse time is in the order of nano- or picoseconds. Shorter pulses in the order of femtoseconds may lead to "cold" ablation of the light-absorbing layer, whereas longer pulses in the order of microseconds may increase the thermal affected area. Typically longer pulses can also be less effective as most heat may be lost due to heat sinking of the carrier and components. The thickness of the adhesive layer can be increased to reduce the heat flow towards the component. By accelerating the release of the component with help of the decomposition layer, the duration of heat transfer to the component may be reduced in order to prevent thermal damage thereto while allowing the adhesive layer to be thinner. While relatively high temperatures are achieved at the light-absorbing layer and melt layer, the component can remain relatively cold in this manner.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
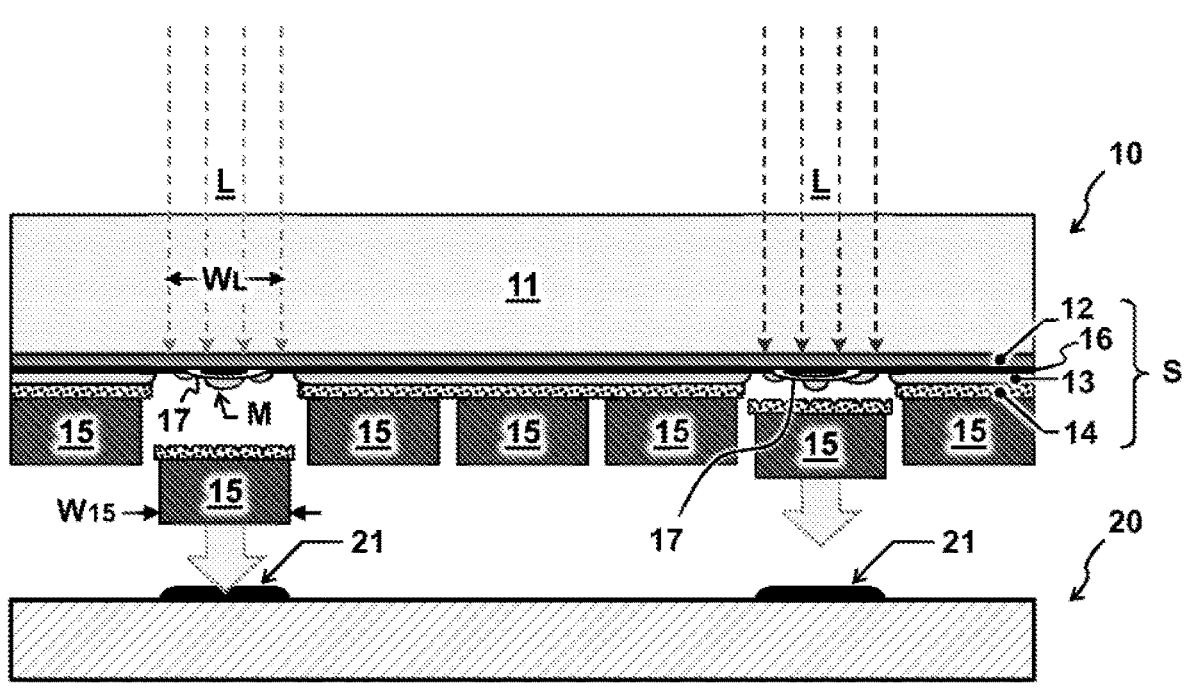
FIG. 1A illustrates transfer of components from a donor substrate to an acceptor substrate by illuminating a release stack.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that the terms "consisting essentially of" and "essentially consists of", as used herein with reference to materials (e.g. metal, semi-conductor, polymer), means that further components may present insofar as these do not materially affect the essential characteristics of the compound or composition. Alternatively, or additionally, these term can be used to signify a majority constituent, e.g. with a mass percentage >90%, >95%, >99, >99.9% or 100% (or simply "consists of"). It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

This present document relates to the deploying of a low gas generation laser release stack in order to rapidly transfer components from a carrier towards an acceptor substrate. In the present invention, a self-limiting bubble formation mechanism is applied in the stack configuration resulting in a convex curvature which enables fast and efficient de-wetting of a molten melting layer from a die during the transfer process. Hence, firstly, due to low pressure build-up, the components transfer at low velocity (without a shock-wave), and in absence of turbulent ambient air or gas, the components do not tend to rotate while being transferred. This increases the yield of end-products by improved control over the correctness of transfer. Secondly, a curvature formed by a self-limiting bubble in the decomposition layer facilitates for more efficient de-wetting of a molten melting layer from a micro-component during the transfer process. This accelerates the release and thus reduces the release time, and thereby the contact time between the hot molten metal layer and the polymeric adhesive layer. A high level of control over the transfer process is thereby reached, while providing a high yield of macro-components via an efficient transfer process with a large throughput. It further enables laser die transfer of larger components, and also reduces debris from a die during laser die release process. The stack consists of a thermally stable light-absorbing layer, a bubble-forming thin decomposition layer, metal melt layer and an adhesive layer. The melting and evaporation temperatures of the various layers are well selected to provide a specific functional effect at a specific time during the process.

The laser-release stack consists out of four functional layers. A light-absorbing metal layer that has a high melting temperature, a very thin degradation layer responsible for a bubble formation (e.g. preferably a metal having a desired evaporation temperature, but in some cases thin oxides, such as $Al_2O_3$ or $SiO_2$, or polymers with high degradation temperature may also be applied) with an evaporation temperature higher than temperature of the metal melt layer, a metal layer with a low melting temperature, and a polymeric adhesive with a decomposition temperature that is closely matched with the melting temperature of the metal melt layer.

The working principle is that the laser beam (having e.g. a relatively long pulse in order of tens of microseconds) rapidly heats up the light-absorbing layer sufficiently, such that the underlaying metal layer starts melting. Note, that decomposition layer deposited in between metal layers is very thin (in order of tens of nanometres only) to prevent hindering heat flowing from an absorbing layer towards a melting layer. While a melting layer reaches its melting temperature transforming from a solid state to a liquid during a relative long pulse, the polymeric adhesive which bonds the component to the metal melt layer starts releasing due to de-wetting effects. This also happens in absence of the decomposition layer, because the surface tension of liquid metal is much higher than the surface energy of solid polymers, and therefore the adhesion is easily lost between the two layers; while in contrast, because the surface energy of a solid metal layer is typically very high, the metal melt layer will stick to a metallic layer, such as the light-absorbing layer. Hence, a molten metal tends to favour to dewet from a polymeric part releasing components along with polymeric part. However, due to an unfavourable aspect ratio of the melting layer this process requires a significant amount of time. The thickness of the melting layer may be in submicron range, because a thick metal layer would require a large energy dose to reach and sustain in the molten state, and as a consequence impose thermal damage to the component. The lateral foot step of the melting layer may be in order of tens of micrometers, matching the dimensions of a typical component. As a result of this aspect ratio, the thin molten liquid bridge formed by the molten melting layer requires significant time to naturally de-wet from the large polymeric surface, to subsequently release the die. This increases the chance of thermal damage to the component, which is undesired.

To accelerate this de-wetting process, with the laser pulse still pumping energy into the release stack while the melting layer melts, the decomposition layer of the invention steps in. With its evaporation temperature above the melting temperature of the melting layer and below the melting temperature of the light-absorbing layer, a thin degradation layer reaches its evaporation temperature in the above process, and thereby a bubble is formed in the layer which causes the surface thereof to become convex. The increasing curvature increases the contact angle between the melt layer and the adhesive layer, and thereby stimulates release. Importantly, the bubble may be laterally confined through an etching or singulation process, preventing it to propagate sideways and thereby preventing it from affecting closely spaced neighbouring dies on the wafer.

The present invention makes it possible to selectively transfer components with small dicing streets in between. This is due to the fact that bubble-formation is not the main driver of the transfer process and may therefore be allowed to take place in a confined area underneath the component to be transferred. Small dicing streets will increase the amount of components that fit on a single wafer. These small dicing streets are not obtainable in blister-assisted laser transfer processes wherein the blister formation is the main driver. This is because in regular methods, due to the blistering being the main driver, the required blisters are required to be large, and are even larger than the component. Larger dicing streets are required to prevent neighbouring components from being released prematurely. Next to that, the regular blister-assisted approaches require a focused laser beam and therefore accurate laser alignment to make sure the components are transferred straight down.

An important advantage of the present invention is the use of the four layer stack, which makes it possible to transfer components with a limited amount or complete absence of gas generation (the gas generated by decomposition layer is very limited and only required to form micro-bubbles and not for actual thrust of the die). This allows to limit the transfer velocity of the components and ensure they follow the desired trajectory. The choice of the materials is important. The surface energies, melting temperatures and evaporation temperatures need to be matched to achieve the desired transfer effect. Self-confinement of the formed bubbles allows to limit effects on neighbouring dies during laser die release, while out of plane deformation of molten melting layer caused by a micro-bubble formation allows for more efficient de-wetting of liquid bridge from a polymeric adhesive. Although the polymeric adhesive layer is transferred together with the component, it can easily be removed afterwards by oxygen plasma for example.

FIG. 1A illustrates transfer of components 15 from a donor substrate 10 to an acceptor substrate 20 by illuminating a release stack "S". In some embodiments, the donor substrate 10 comprises a transparent carrier 11 configured to carry the components 15 facing the acceptor substrate 20. Preferably, the release stack "S" is disposed between the transparent carrier 11 and the components 15 for releasing one or more of the components 15 from the donor substrate 10 onto the acceptor substrate 20. Typically, the release follows directly after illumination of the release stack "S" by a light beam "L" through the transparent carrier 11.

In some embodiments, the release stack "S" comprises a melt layer 13, e.g. having a relatively low melting temperature "Tm13". In other or further embodiments, the release stack "S" comprises a light-absorbing layer 12 disposed between the transparent carrier 11 and the melt layer 13. In one embodiment, the light-absorbing layer 12 has a relatively high absorption coefficient. This may allow efficiently absorbing the light beam "L" thereby causing the light-absorbing layer 12 to be heated. In another or further embodiment, the heated light-absorbing layer 12 is in thermal contact with the melt layer 13. This may allow conducting of the heat to the melt layer 13. In this way a temperature of the melt layer 13 can rise above its melting temperature "Tm13". Preferably, the light-absorbing layer 12 has a relatively high melting temperature "Tm12" which is higher than the melting temperature "Tm13" of the melt layer 13. In this way, the light-absorbing layer 12 can remain essentially solid while the melt layer 13 is essentially melted by the heat conducted from the light-absorbing layer 12. In some embodiments, the release stack "S" further comprises a decomposition layer 16, between the light-absorbing layer 12 and the melting layer 13. The decomposition layer, in certain embodiments, may comprise a material having an evaporation temperature "Te16" which is above the melting temperature "Tm13" of the melting layer 13, and which is below the melting temperature "Tm12" of the light-absorbing layer 12. In this manner, the decomposition layer 16 while being heated above its evaporation temperature "Te16" may form a bubble 17. The bubble 17 may stimulate or accelerate release of the component 15, which may be attached to the melting layer 13 through an adhesive layer 14. The formation of bubble 17 is not the main driver for the release, but merely accelerates the release. The release is driven primarily by the melting of the melt layer 13 and the changes in adherence between the various layers of the release stack "S" caused by the phase change from solid to liquid, which changes the wetting properties (as explained further below). The bubble 17 stimulates the release by setting the interface between melt layer 13 and decomposition layer 16 into motion, and by changing the curvature of the melt layer 13 which in turn stimulates reduction of the contact area between the melt layer 13 and the layer underneath (e.g. typically an adhesive layer 14). In other or further embodiments, the release stack "S" comprises such an adhesive layer 14 disposed between the components 15 and the melt layer 13. This allows easily adhering the components 15 to the melt layer 13 while the melt layer 13 is solid and releasing adhesion when the melt layer 13 is melted (indicated by "M" in the figures).

Some embodiments comprise selectively illuminating an area of the light-absorbing layer 12, forming a part of the release stack "S" holding a respective component 15, with a light beam "L" through the transparent carrier 11. In this way a respective part of the light-absorbing layer 12 can be selectively (locally) heated. Preferably, the heat is conducted to an adjacent melt layer 13 of the release stack "S", via the decomposition layer 16 in between the light-absorbing layer 12 and the melt layer 13. In this way the adjacent melt layer 13 can be at least partially melted. Preferably, the respective part of the light-absorbing layer 12 remains substantially solid while the melt layer 13 is melted. Advantageously, the melting of the adjacent melt layer 13 can cause a loss of adhesion between the adjacent melt layer 13 and a respective part of the adhesive layer 14 of the release stack "S" adhering the respective components 15 to the adjacent melt layer 13. Accordingly, the loss of adhesion can cause release and transfer of the respective component 50. For example, the release allows the component to fall and/or be pushed from the donor substrate 10 to the acceptor substrate 20. In the present invention, the release of the component 15 is stimulated by the forming of bubble 17 in decomposition layer 16 between the melt layer 13 and the light absorbing layer 12. The decomposition layer 16 has an evaporation temperature "Te16" which is above the melting temperature "Tm13" of the melt layer 13. After the melt layer 13 has molten, the temperature rises further while energy is continued to be added via the light beam "L" for the duration of the light pulse. This causes the decomposition layer to melt and thereafter evaporate upon reaching temperature "Te16", forming a bubble 17. The bubble formation sets the release of component 15 in progress. Although the component 15 would have been released as well in absence of a decomposition layer 16 in the stack "S", the forming of bubble 17 advances the moment of release and thereby enables the component 15 to receive less heat during the transfer process. As a result, components 15 are less prone to thermal damage during the transfer process.

Preferably, the donor substrate 10 is arranged above the acceptor substrate 20 so a force of gravity may help in the transfer. Alternatively, or additionally, the transfer can be induced by forces following the illumination. For example, the release can be induced by the melting and/or accompanied by at least some gas formation. Aspects of the present disclosure can also be embodied as a system comprising the donor substrate 10 as described herein. For example, the system comprises a light source configured and/or controller configured to generate the light beam "L" as described herein.

In some embodiments, the melt layer 13 comprises or essentially consists of metal. The inventors find that a metal melt layer can provide particular benefit to the present methods and systems, e.g. providing a steady connection to various types of adhesive materials and well controlled release of the adhesion at a predictable melting point. Alternatively, or additionally, also other melting materials can be used, e.g. semi-conductor material, alloys, etc. Advantageously, e.g. for the purposes of a melt layer as described herein, eutectic alloys may combine the bonding characteristics of the component metals with the flow properties of pure metals. Furthermore, such alloys can transform directly from solid to liquid state, or vice versa from liquid to solid state, at a specific composition and temperature without passing a two-phase equilibrium. Furthermore, the eutectic temperature can be much lower than the melting temperature of the two or more pure elements. As may be appreciated, a lower melting temperature "Tm13" is beneficial to the choice of materials suitable for the decomposition layer 16, because the evaporation temperature "Te16" thereof must lie above the melting temperature "Tm13" of the melt layer 13 and below the melting temperature "Tm12" of the light-absorbing layer 12.

The decomposition layer 16, in accordance with other or further embodiments, may likewise consist of metal (although alternatives thereto are available). The choice of material depends also on the choice of material of the melt layer 13, because the evaporation temperature "Te16" of the decomposition layer 16 is linked to the melting temperature "Tm13" of the melt layer 13. Similarly, also the choice of material for the light-absorbing layer 12 could affect the choice of suitable candidate materials for the decomposition layer 16, because the evaporation temperature "Te16" of the decomposition layer 16 must be below the melting temperature "Tm12" of the light-absorbing layer 12. For example, if aluminium (Al) would be used for the melt layer 13 and molybdenum (Mb) would be applied as light-absorbing layer 12, the decomposition layer 16 could be made of for example silver (Ag), gold (Au) or copper (Cu). The table below, for example, in this example shows the corresponding melting and evaporation temperatures (at atmospheric ambient pressures):

| Material | Abbr. | Melting temp, ° C. | Evaporation temp, ° C. |
|---|---|---|---|
| Molybdenum | Mo | 2620 | 5560 |
| Aluminum | Al | 660 | 2327 |
| Copper | Cu | 1084 | 2595 |
| Gold | Au | 1063 | 2600 |
| Silver | Ag | 961 | 1950 |

The above materials are certainly not the only candidates, for example other metals or alloys, or even non-metals may be identified having the desired properties to be useable for the decomposition layer 16. For example, some oxides ($Al_2O_3$ and $SiO_2$) have been mentioned before, which have been tested with acceptable results. Thus, the list of candidate materials is certainly not limited to the materials mentioned, but the skilled person being made aware of the requirements for selection (which have been described above) is deemed able to identify the various candidate materials dependent on the choice of material made for the melt layer 13 and the light-absorbing layer 14. For example, other or additional candidates may be found in case the melt layer 13 would be made of e.g. Zinc (Tm≈420° C.), Tin (Tm≈232° C.), and/or Indium (Tm≈156° C.).

In other or further embodiments, the light-absorbing layer 12 comprises or essentially consists of metal. The inventors find that a metal light-absorbing layer 12 can provide particular benefit to the present methods and systems, e.g. providing relatively good thermal conduction. Moreover, the inventors find that when both the light-absorbing layer 12 and melt layer 13 are metal layers, the melted melt layer 13 may tend to stick more to light-absorbing layer 12 than to the adhesive layer 14, in particular when the adhesive layer 14 is not a metal layer. The same is true for the decomposition layer 16: while this layer is still solid, the melted melt layer 13 may tend to stick more to the decomposition layer 16 than to the adhesive layer 14. Likewise, when molten and on the verge of evaporating (such as to form bubble 17), a decomposition layer 16 made of metal (e.g. silver (Ag)) also adheres well to light-absorbing layer 12 in case it is made of metal (e.g. Mb). Similar advantages may also be achieved using a light-absorbing layer made of a semi-conductor material, e.g. including silicon and silicon carbide.

In some embodiments, the adhesive layer 14 comprises or essentially consists of a polymer based adhesive, preferably a cross-linking polymer such as an epoxy. Advantageously, a polymeric adhesive typically has relatively low heat conduction compared to metal, so heat conduction to the components 15 can remain relatively low. Moreover, the surface tension of liquid metal is typically much higher than the surface energy of solid polymers. So the adhesion between the adhesive layer 14 and melt layer 13 can be released. In contrast, because the surface energy of a solid metal layer is typically relatively high, the metal melt layer 13 may predominantly stick to the metallic decomposition layer 16 and light-absorbing layer 12. This means that, in some embodiments, only the polymeric part is transferred together with the component. Also other materials could be envisaged for the adhesive layer, preferably comprising, or essentially formed by, an organic and/or non-metal layer.

Irrespective of the specific materials, it is preferred that the light-absorbing layer 12 has a higher surface energy per unit area (e.g. mJ/m²) than the adhesive layer 14, e.g. by at least a factor two, three, five, ten, twenty, fifty, or more. The higher the difference in surface energy, the more the melted material may tend to stick to the light-absorbing layer 12 instead of the adhesive layer 14. Typically, the surface energy of the melt layer 13 is lower than the light-absorbing layer 12 it melts at lower temperature, and most preferably higher than the adhesive layer 14. In one embodiment, upon melting of a melt layer 13 in the release stack "S" of a selected component 15, the melt layer 13 predominantly sticks to the decomposition layer 16 (while still solid) and thereafter to the light-absorbing layer 12 of the release stack "S" while the adhesive layer 14 of the selected components 15 predominantly sticks to the selected component 15. For example, the adhesive layer 14 is transferred to the acceptor substrate 20 with the selected component 15 while the melt layer 13 predominantly remains with part of the release stack "S" on the donor substrate 10. Preferably, the transferred adhesive layer 14 is removed from the selected component 15 after transfer. For example, a polymeric adhesive layer 14 can be removed from the component through wet or dry etching. For example, more than fifty percent of the melted material sticks to the light-absorbing layer 12, preferably more than seventy, or even more than ninety percent. Most preferably substantially all of the melted material remains with the stack on donor substrate 10.

Figure 1B:
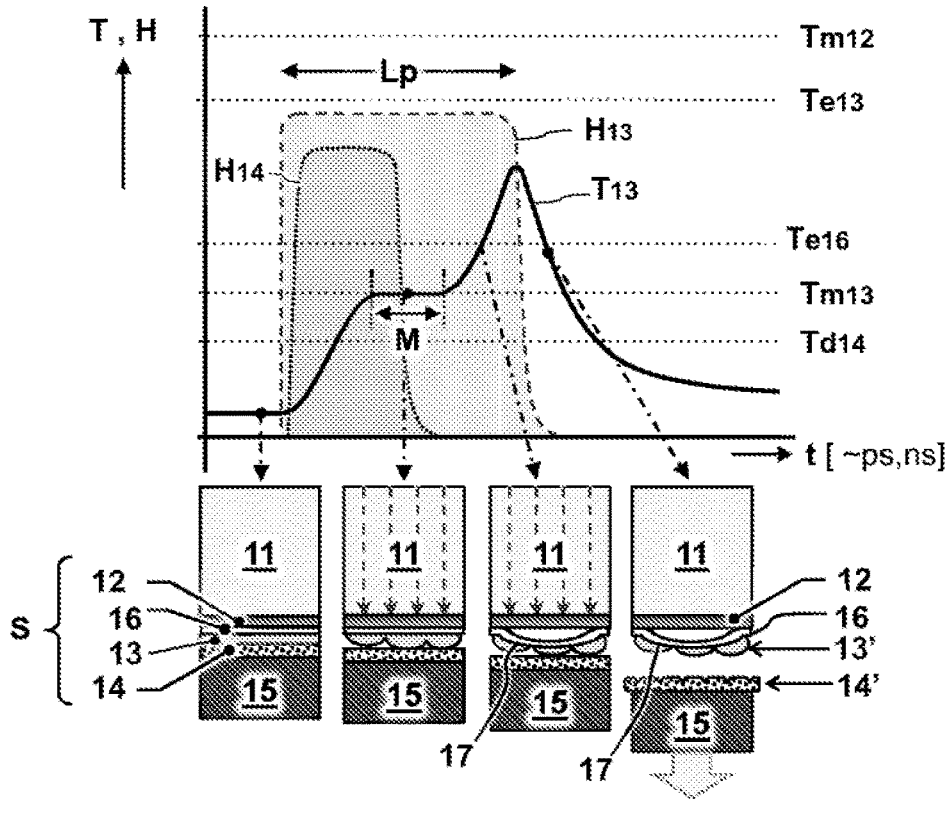
FIG. 1B illustrates relative temperatures and a sequence of releasing a component by light induced heating of select layers in the release stack.

FIG. 1B illustrates various temperatures "T" and a sequence of releasing a component 15 by light induced heating "H" of select layers in the release stack "S". Without being bound by theory, the graph illustrates a duration of a light pulse "Lp", resulting in heat transfer "H13" to the melt layer 13, heat transfer "H14" to the adhesive layer 14, and the resulting melt layer temperature "T13" (arbitrary scaling). Below the graph, various stages of the component release are shown. As illustrated in the graph, the melt layer temperature "T13" typically first increases due to heat transfer "H13" caused by the light pulse "Lp" illuminating the light-absorbing layer. When the melt layer temperature "T13" reaches the melting temperature "Tm13", the rise in temperature may plateau while energy of the heat transfer "H13" is used for melting the material indicated by "M". The temperature rises further after the melt layer 13 has molten, and reaches temperature "Te16". This is the temperature at which one or more bubbles 17 are formed in the decomposition layer 16, stimulating the release and transfer of the component 15. As a further consequence to the melting of the melt layer 13, contact between the melt layer 13 and the adhesive layer 14 can be lowered and is eventually lost so the heat transfer "H14" to the adhesive layer 14 may be halted even while heat transfer "H13" to the melt layer 13 may continue. Advantageously, the halted heat transfer "H14" to the adhesive layer 14 may alleviate disintegration of the adhesive layer 14 and/or alleviate damage to the component 15 due to overheating. So in effect, the melt layer 13 can also act as a buffer protecting the component 15 from damage.

In some embodiments, the relatively low melting temperature "Tm13" of the melt layer 13 is less than thousand degrees Kelvin (<~700° C.), preferably less than six hundred degrees Kelvin (<~300° C.). The lower the melting temperature of the melt layer 13, the less energy may be needed for melting, e.g. allowing a less intense light beam "L" and/or less chance of damaging the component. For example, suitable materials for the melt layer may include Aluminium (Tm≈660° C.), Zinc (Tm≈420° C.), Tin (Tm≈232° C.), and/or Indium (Tm≈156° C.).

In other or further embodiments, the melting temperature "Tm12" or disintegration/evaporation temperature in case of a non-melting material of the light-absorbing layer 12 is higher than the melting temperature "Tm13" of the melt layer 13. Furthermore, the melting temperature "Tm12" or disintegration/evaporation temperature in case of a non-melting material of the light-absorbing layer 12 is also higher than the evaporation temperature "Te16" of the decomposition layer 16, e.g. by at least ten degrees Kelvin, preferably at least fifty degrees Kelvin, more preferably at least one hundred degrees Kelvin, most preferably at least two hundred degree Kelvin, or even more than five hundred degrees Kelvin. The higher the difference between the melting temperature Tm13 and evaporation temperature Tm16 on one hand and the melting temperature Tm12 on the other hand, the easier it can be ensured that the light-absorbing layer 12 remains substantially solid while the melt layer 13 is at least partially melted and a bubble is formed in the decomposition layer by the heat conducted from the light-absorbing layer 12. Preferably, the melting temperature "Tm12" or disintegration/evaporation temperature in case of a non-melting material is at least thousand degrees Kelvin ≥~700° C., more preferably at least two thousand degrees Kelvin. A particularly suitable metal for use in the light-absorbing layer 12 includes Molybdenum which has a relatively high melting temperature of 2896 K (2623° C.). Also other metal with relatively high melting temperature can be used such as Chromium (2180K, 1907° C.). Alternative to metals, also other materials can be used for the light-absorbing layer 12, e.g. semiconductor materials or other materials capable of conducting heat to the melt layer 13 while remaining solid, preferably having relatively high absorbance to the light beam "L". In some embodiment, a wetting control layer 12w can be provided between the (main) light-absorbing layer 12 and the melt layer 13. For example, suitable materials for the wetting control layer 12w may include oxides such as aluminium oxide or silicon oxide. As these material likewise provide workable alternatives for the decomposition layer 16, embodiments comprising a thin layer of aluminium oxide or silicon oxide provide a decomposition layer 16 having a double function, which may be beneficial in certain applications.

In some embodiments, the light beam "L" illuminating the release stack "S" is configured to cause a temperature "T13" of the melt layer 13 to rise above its melting temperature "Tm13" but remain below its evaporation temperature Te13. For example, an intensity and/or duration of the light beam "L" is adapted in relation to an absorbance of the light-absorbing layer 12 to cause a specific amount of energy of the light beam "L" to be deposited in the light-absorbing layer 12 leading to a specific rise in temperature of the light-absorbing layer 12 and specific amount of heat transfer to the melt layer 13 sufficient to cause the melt layer 13 to melt but not sufficient to cause substantial boiling and/or evaporation of the melt layer 13. The more evaporation of the melt layer 13 can be prevented, the more controlled can be the release of the components 15. For example, an explosive release of the components can be alleviated. Advantageously, the evaporation or boiling temperature of the melt layer can be much higher than its melting temperature, especially for a metal melt layer. For example, the evaporation temperature Te13 of the melt layer 13 is higher than its melting temperature "Tm13" by at least five hundred degrees Kelvin, preferably at least one thousand degrees Kelvin, or even more than fifteen hundred degrees Kelvin. The higher the difference between the melting and evaporation temperatures, the easier evaporation of the melt layer can be prevented.

In some embodiments, the adhesive layer 14 has a disintegration temperature Td14 that is above the melting temperature "Tm13" of the melt layer 13 [Td14>Tm13], or at least within (higher than) five hundred degrees Kelvin below the melting temperature "Tm13" of the melt layer 13 [Td14>(Tm13−500K)], preferably within four hundred degrees Kelvin, or within three hundred degrees Kelvin. The higher the evaporation or disintegration temperature Td14 of the adhesive layer 14, the better inadvertent disintegration can be prevented, and a more controlled release of the component 15 obtained. It is noted that the disintegration temperature Td14 of the adhesive layer 14 is typically applicable for prolonged exposure to that temperature. So it can be tolerated that the adhesive layer 14 is shortly exposed to temperatures of the adjacent melt layer 13 above the disintegration temperature Td14, also because the melted material tends to stick to the light-absorbing layer 12 and/or dewet from the adhesive layer 14. For example, suitable materials for the adhesive layer may include photoresist materials such as SU-8. Also other materials can be used, e.g. polyimide.

As non-limiting examples, consider the following table with approximate parameters.

| Material | Function | Surface energy (mJ/m²) | Melting temp. (° C.) | Evaporation (° C.) |
|---|---|---|---|---|
| Molybdenum | light-absorbing layer | 2050 | 2623 | 5560 |
| Chromium | light-absorbing layer | 1642 | 1907 | 2944 |
| Copper | decomposition layer | 1103 | 1084 | 2595 |
| Gold | decomposition layer | ≈1400 | 1063 | 2600 |
| Silver | decomposition layer | ≈900 | 961 | 1950 |
| Aluminum oxide | decomposition/wetting control layer | 638 | 2072 | 2977 |
| Silicon dioxide | decomposition/wetting control layer | 287 | 1710 | 2950 |
| Aluminum | melting layer | 840 | 660 | 2327 |
| Tin | melting layer | 526 | 232 | 2602 |
| Indium | melting layer | 560 | 156 | 2072 |
| Polyimide | adhesive layer | 43 | NA | ~500 (at low heating rate) |
| SU-8 | adhesive layer | 33-38 | NA | ~350 (at low heating rate) |

In some embodiments, the light beam "L" illuminating the release stack "S" is provided as a relatively short a light pulse, e.g. having a FWHM duration of less than one millisecond, preferably less than hundred nanosecond, more preferably less than ten nanosecond, or even less than one nanosecond. For example, the light can be provided as a nanosecond or picosecond pulse. The shorter the light pulse, the higher the intensity per unit of time for the duration of the pulse. This may cause relatively short and intense heating of the stack, and melting of the component preferably before heat disintegrates the adhesive layer 14 and/or before the heat damages the components 15.

In some embodiments, the light-absorbing layer 12 is configured to absorb at least ten percent of the light beam "L" illuminating the release stack "S", preferably at least twenty percent, more preferably at least fifty or sixty percent, most preferably at least ninety percent. For example, the light beam "L" has a wavelength between 100-2000 nm (e.g. monochrome or broadband light), preferably a NIR laser (e.g. 1064 nm). Also other wavelengths can be used, e.g. UV, visible or infrared, as long as the material of the light-absorbing layer 12 can sufficiently absorb that wavelength.

In some embodiments, the light beam "L" is configured to exclusively illuminate a subarea of the light-absorbing layer 12 forming part of a selected release stack "S" holding a selected component 15, without illuminating immediately adjacent areas the light-absorbing layer 12, thereby exclusively releasing the selected component 15 while adjacent components remain attached to the donor substrate 10. For example, the light beam "L" has a beam width "WL" that is approximately equal to or smaller than a width "W15" of the selected component, and/or the light beam "L" is centred on the selected component. In one embodiment, the light beam "L" is generated having a relatively narrow beam width which illuminates one or more subareas of the release stack "S" corresponding to one or more components. In another or further embodiment, the light beam "L" is focused to a relatively narrow beam width, e.g. using one or more lenses/mirrors projecting a relatively small spot onto the one or more subareas of the release stack "S". In another or further embodiment, a relatively wide light beam "L" is shaped or patterned, e.g. using a mask pattern, to generate one or more relatively narrow light beams impinging the one or more subareas of the release stack "S". In one embodiment, the light beam "L" is generated by a laser, e.g. illuminating a specific component or part of a mask pattern. Also other light sources can be used, e.g. a flash lamp illuminating part of a mask pattern, or the whole mask.

Figure 2A:
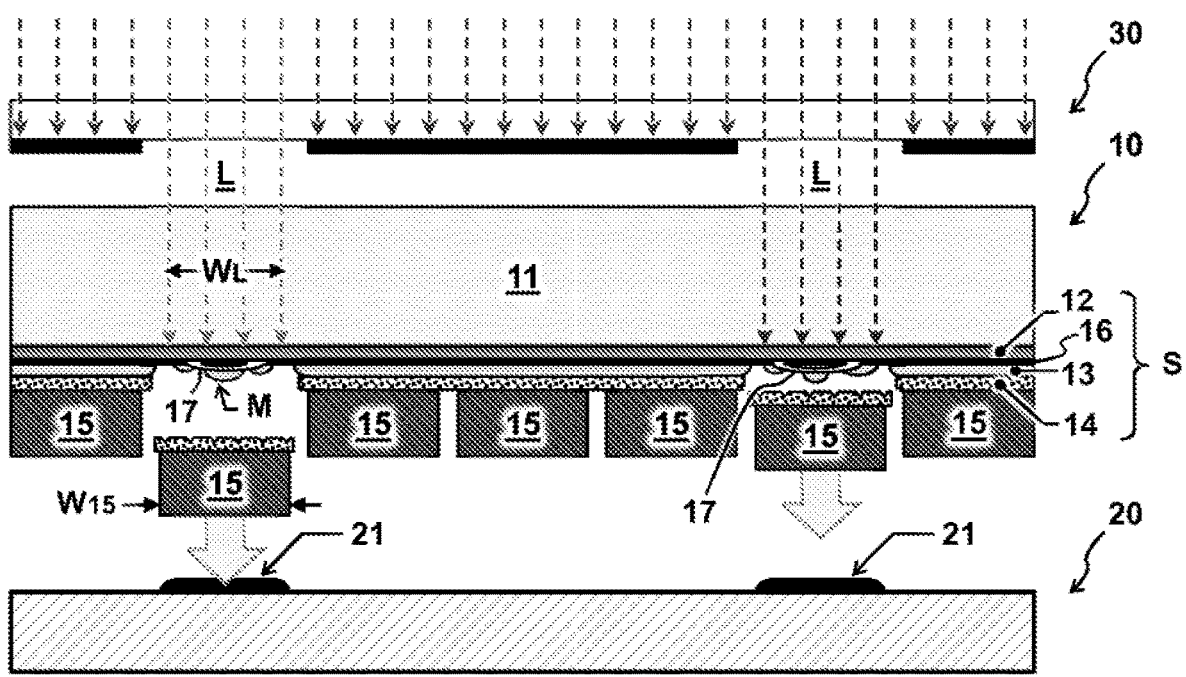
FIGS. 2A and 2B illustrate further aspects including cutting and/or etching parts of the release stack
Figure 2B:
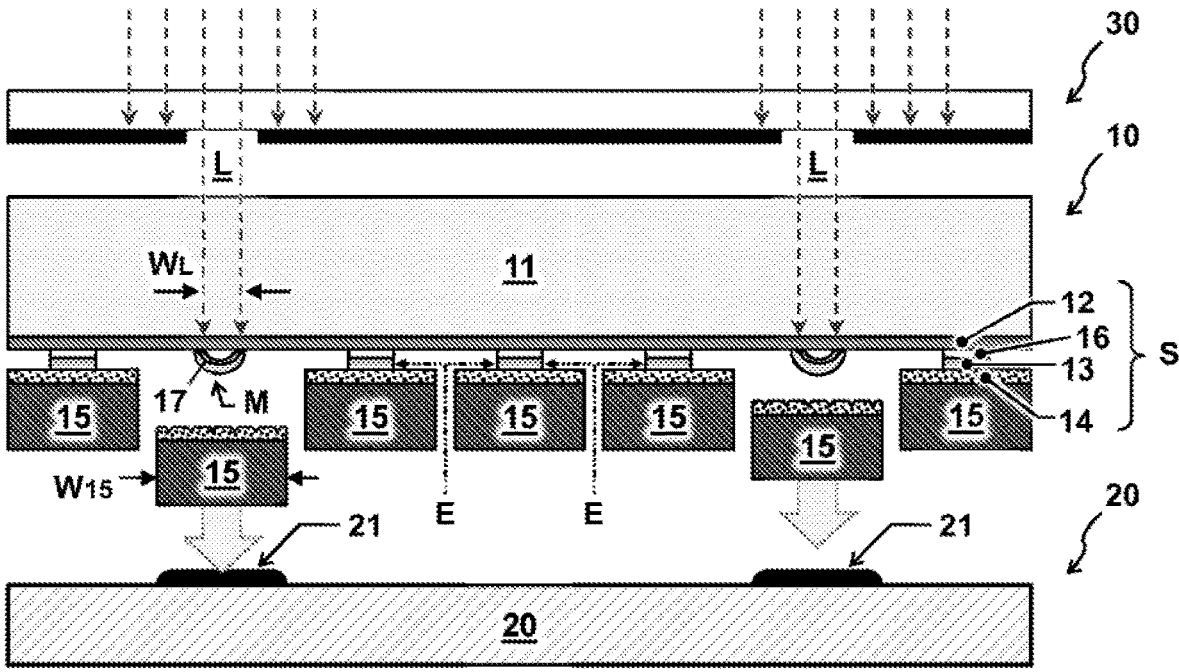

FIGS. 2A and 2B illustrate further aspects including cutting and/or etching parts of the release stack "S". In some embodiments, the release stack "S" is at least partially segmented or diced, e.g. along lanes or cut lines "C", between and/or around the components 15 (in projected view). For example, one or more layers of the stack can be segmented before or after connecting the components, preferably at least prior to the transfer. Preferably, at least the adhesive layer 14 is segmented so that parts of the adhesive layer 14 holding different components 15 are separate from each other. In this way, the transfer of individual components 15 can be better controlled with less interference of intermediate pieces of the adhesive layer 14. More preferably, also the melt layer 13 is segmented so that parts of the melt layer 13 corresponding to different components 15 are separate from each other. In this way, the melted material of a released component can remain separate from the melt layer 13 of adjacent components e.g. preventing interference with later released components. More preferably, also the decomposition layer 16 is segmented so that parts of the decomposition layer 16 corresponding to different components 15 are separate from each other. In this way, a bubble 17 formed in the decomposition layer 16 upon reaching its evaporation temperature Tm16 will be self-limited within the patch underneath the component 15 to be separated. This prevents the accidental loss of neighbouring components 15 during the transfer. Most preferably, also the light-absorbing layer 12 is segmented so that parts of the light-absorbing layer 12 corresponding to different components 15 are separate from each other. In this way heating of the light-absorbing layer 12 can remain better localized and/or heat transfer to adjacent areas of the light-absorbing layer 12 corresponding to neighbouring components prevented. It can also be beneficial for aligning the laser to the components from the backside.

In some embodiments, e.g. as shown in FIG. 2B, at least part of the melt layer 13 is removed to provide respective undercuts between the components 15 and the donor substrate 10. In one embodiment, an area of the melt layer 13 holding a respective component 15 is smaller than an area of the respective component, e.g. by at least a factor two, three, four, five, or more. By providing a relatively small area melt layer 13, this material can be more easily melted to release the component without melting adjacent parts of the melt layer 13. Preferably, the smaller area is still centred on the respective component, e.g. to alleviate rotating of the component during transfer. In connection therewith, and in accordance with some of these embodiments, also the thin decomposition layer 16 may be of similar size as the melt layer 13, as illustrated in the figure. The self-limiting bubble 17 formed by the decomposition layer 16 reaching its evaporation temperature Te16, will remain adhered to the surface of the light-absorbing layer 12 due to the surface tension of the layer. In another or further embodiment (not shown), the adhesive layer 14 can also have a smaller area, e.g. so less material needs to be removed later. In another or further embodiment not shown, also the light-absorbing layer 12 can have a smaller area to further improve heat separation with neighbouring components. For example, parts of the melt layer 13 and/or other layers can be removed below the components by etching indicated by "E". In other or further embodiments, a width "WL" of the light beam "L" is smaller than a width "W15" of the respective component 15 being released. For example, the area or width "WL" of the light beam "L" can be adjusted to the area of the melt layer 13.

Figure 3A:
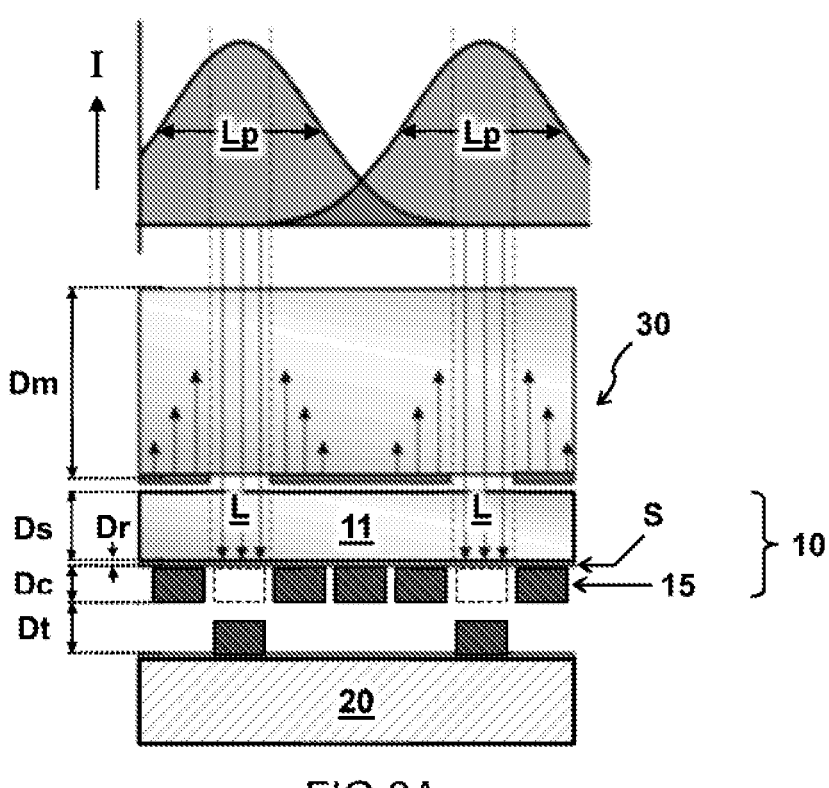
FIG. 3A illustrates masking of light pulses to form relatively narrow light beams, and relative thicknesses of various layers.

FIG. 3A illustrates masking of light pulses "Lp" to form relatively narrow light beams L, and relative thicknesses of various layers. In some embodiments, a mask 30 is aligned with the donor substrate 10. In one embodiment, the mask 30 comprises a set of mask windows (open areas) aligned with a subset of the components 15 on the donor substrate 10. In another or further embodiment, a set of light spots (e.g. light pulses Lp) is used to sequentially or simultaneously illuminate the set of mask windows. In another or further embodiment, a respective light spot (e.g. laser spot) is larger than a respective mask window (being illuminated, the light spot preferably centred on the window), e.g. with a full width half maximum (FWHM) spot size (diameter) larger than a width of the mask window by at least a factor two, three, or more but small enough, e.g. less than a factor four or five, such that the tail of the spot does not substantially illuminate an another mask window. Typically, a laser spot has a gaussian intensity profile. By masking the spot such that only a central part of the spot is passed through the mask window, the intensity profile can be relatively flat, which may benefit controlled release.

Preferably, the transparent carrier 11 of the donor substrate 10 is formed by a relatively thin foil, e.g. having a thickness "Ds" less than two, or even less than one millimeter. The thinner the transparent carrier, the easier it can be to illuminate the stack therethrough (e.g. with a mask). For example, the donor substrate 10 can be a flexible or rigid substrate. Typically, the components are very small, e.g. having a thickness "Dc", height, or other cross-section dimension less than hundred micrometer, less than fifty micrometer, or even less than thirty micrometer. Typically, the release stack "S" has a thickness "Dr" that is much smaller still, e.g. less than ten micrometer, or even less than one micrometer. Preferably, the components 15 are transferred contactlessly from the donor substrate 10 to the acceptor substrate 20, e.g. over a transfer distance "Dt" between one and hundred micrometer, preferably between twenty and sixty micrometer. These ranges can, on the one hand provide sufficient distance to prevent inadvertent contact, and on the other hand be sufficiently proximate to allow controlled transfer. Alternatively, also other distances can be used. In some embodiments, it is preferable that the transfer distance is larger than the thickness of the component, so the technology can also be used for repair purposes.

In one embodiment, the light-absorbing layer 12 has a layer thickness less than 500 nm, preferably less than 250 nm, e.g. between 50-150 nm. Providing a relatively thin light-absorbing layer 12 can allow relatively rapid heating of this layer. On the other hand the layer may need some thickness to absorb the light. In another or further embodiment, the melt layer 13 has a layer thickness less than 500 nm, preferably less than 250 nm, e.g. between 50-150 nm. Providing a relatively thin melt layer 13 can allow relatively rapid heating and melting of this layer. On the other hand the layer may need some thickness to provide its function. In another or further embodiment, the melt layer 13 has a layer thickness less than one micrometer, e.g. between 50-500 nm. The decomposition layer 16, in accordance with another or further embodiment, preferably should be thin in comparison to the melt layer 13. The reason for this is that it preferably should heat up relatively fast after the melt layer 13 has reached the liquid phase, and furthermore the heat conduction from the light-absorbing layer 12 to the melt layer 13 should remain efficient. Therefore, the decomposition layer 16 preferably could be a factor five to twenty thinner than the melt layer 13. However, there is a lower limit to the thickness as well, because the layer requires enough thickness to be able melt and form a bubble 17. Therefore, a decomposition layer 16 may typically have a thickness in the order of tens of nanometers; to give a numerical range, the thickness of decomposition layer 16 could be between 5 and 100 nanometers, preferably between 5 and 50 nanometers. Furthermore, in principle, the thinner the adhesive layer 14, the less material need later be cleaned (if this is even needed at all). On the other hand the layer may need some thickness dependent on its function, e.g. more than 250 nm. Also other layer thicknesses can be used.

As a non-limiting example, a donor substrate was prepared as follows. Starting with a clean quartz/glass transparent carrier, a light-absorbing layer of 130 nm molybdenum is sputtered onto the carrier. A melt layer of 120 nm aluminium is sputtered onto the previous layer. An adhesive layer of 500 nm SU-8 is spin coated onto the previous layer. The carrier and stack are soft baked at 95° C. for 2 minutes. Components are vacuum laminated onto the carrier/stack for 15 minutes at 120 C. Temporary polymeric tape is removed from the components. Oxygen plasma is applied for 1 hour at 500 W to remove SU-8 in between components. Aluminium and molybdenum are etched for 2 minutes in PES etchant 77-23-04. SU-8 resist is hard baked at 250° C. for 3 hours. Of course also other materials, layer thicknesses, temperatures, et cetera, can be used.

In some embodiments, the mask 30 is formed by a pattern of light absorbing material disposed on a transparent carrier forming respective mask windows which can be aligned with parts of the release stack "S" holding respective components 15. As a non-limiting example, a mask substrate was prepared as follows. Starting with a clean quartz/glass transparent carrier, a light-absorbing layer of 130 nm molybdenum is sputtered onto the carrier. A 2 μm HPR504 resist is spin coat onto the light-absorbing layer. The stack is soft bake at 95° C. for 2 minutes. The resist is selectively illuminated according to the mask pattern. HPR504 resist is developing. The HPR504 resist is-hard baked at 120° C. for 2 minutes. Molybdenum is etching for 30 seconds in PS etchant. HPR504 resist is removed by micro stripping. The mask substrate is cleaned. Advantageously the same or similar light-absorbing material can be used for the mask 30 as for the light-absorbing layer 12 in the release stack "S". Also other materials can be used, e.g. a standard chrome on quartz mask, as chromium melts at 1907° C. and damage will not occur at the fluence and laser power to melt the aluminium layer.

Figure 3B:
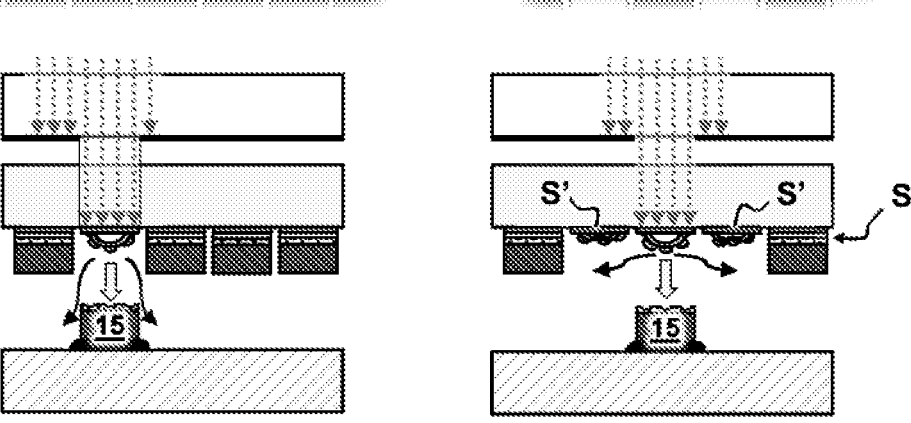
FIG. 3B illustrates sequential release of the components.

FIG. 3B illustrates sequential release of the components 15. In some embodiments, the components are released from the donor substrate 10 according to a specific sequence wherein at least some, preferably a majority of the component, most preferably each component 15 in the sequence selected for release either has four directly adjacent neighbouring components on all sides (as shown in FIG. 3B left side), or no directly adjacent neighbouring components on any side (as shown in FIG. 3B right side). In one embodiment, also a combination can be used, e.g. two directly adjacent neighbouring components on a first set of two opposite sides and no directly adjacent component on a second set of opposite sides (not shown). For example, the absent neighbouring components may have been absent initially or released previously when they were surrounded by the still present components. By balancing the presence or absence of directly adjacent neighbouring components on opposite sides, the release of the component can be more balanced, e.g. allow gas generation of the adhesive layer to propel the components away with controlled directionality. For example, the components can be released according to a checkerboard pattern as shown. Also other patterns may be envisaged. Furthermore, it will be appreciated that the while the release sequence provides particular advantages in combination with the specific release stacks described herein, the sequence can in principle benefit light induced transfer of components using any type of release stack, in particular where the components are released involving gas generation in the stack.

Figure 4A:
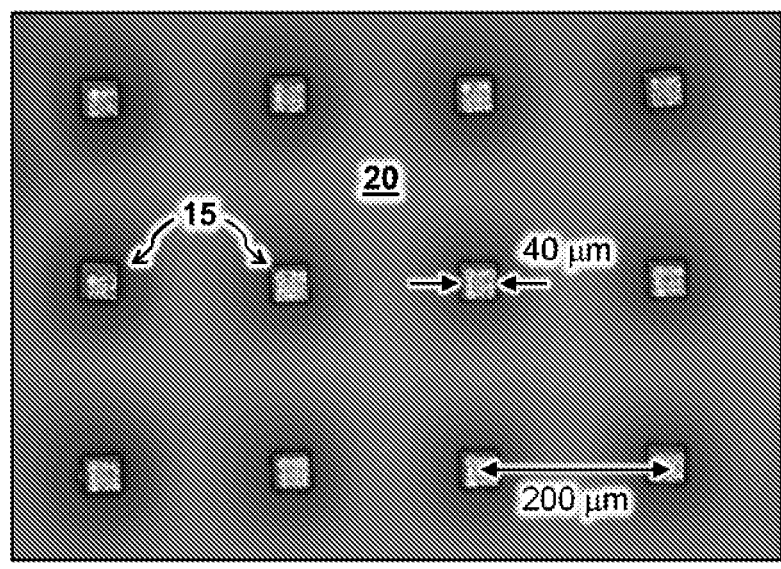
FIGS. 4A and 4B illustrate photographs of components transferred to an acceptor substrate.
Figure 4B:
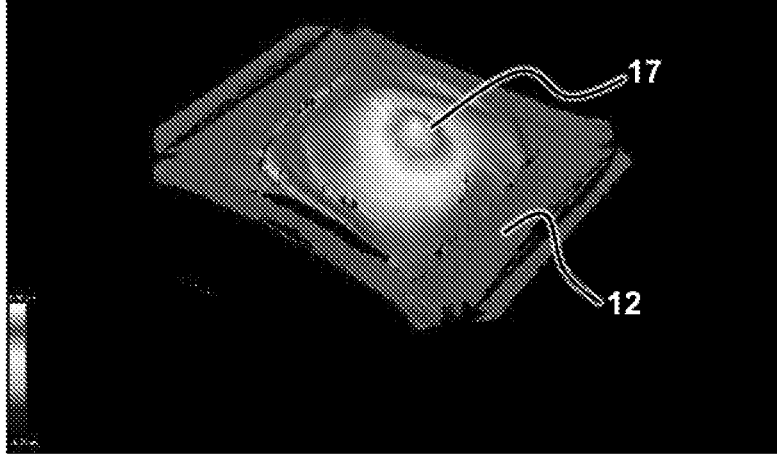
Figure 4C:
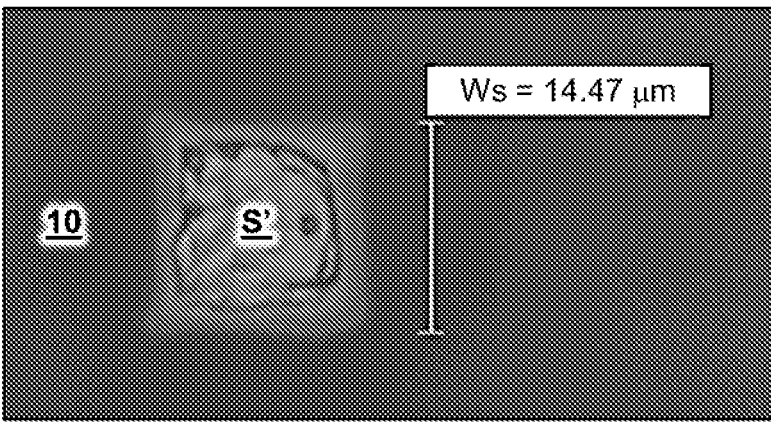
FIG. 4C illustrates part of the remaining stack on the donor substrate.

FIG. 4A illustrates a photograph of components 15 transferred to an acceptor substrate 20 using the methods described herein. In this case the transferred components are 40×40 μm$^2$ chips with 200 μm pixel pitch. FIG. 4B is a photograph of the surface of a bubble 17 remaining present on the surface of a light-absorbing layer 12 after the component 15 has been transferred. The convex curvature of the surface is well visible. FIG. 4C illustrates part of a remaining stack S' on the donor substrate 10. In this case molten Aluminium on Molybdenum is visible after the component is transferred. As shown, the width "Ws" of the remaining stack is about 15 μm, e.g. smaller than the transferred component.

Figure 5A:
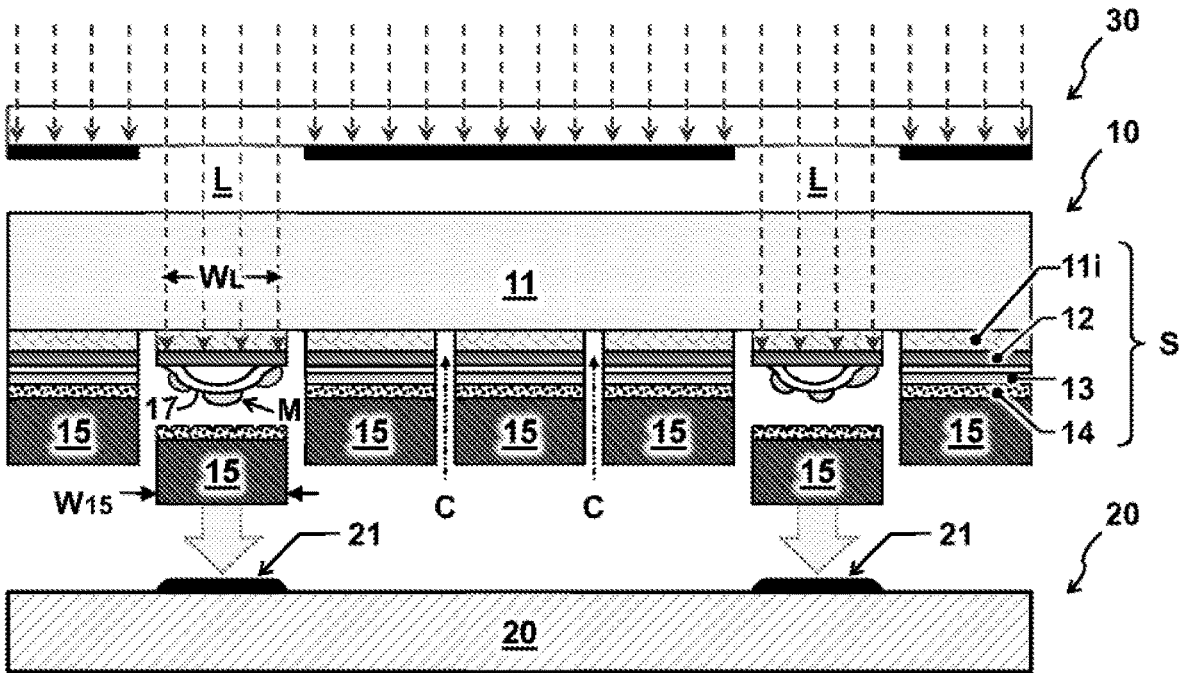
FIGS. 5A and 5B illustrate further layers in the release stack.

FIG. 5A illustrate an embodiment wherein the donor substrate 10, e.g. stack "S", comprises a thermal insulating layer 11i between the transparent carrier 11 and the light-absorbing layer 12. Accordingly, both the thermal insulating layer 11i and light-absorbing layer 12 can be disposed between the transparent carrier 11 and the melt layer 13. In some embodiments, the thermal insulating layer 11i has a relatively low heat conductivity, e.g. lower than that of a material forming the transparent carrier 11. In other or further embodiments, the thermal insulating layer 11i has a relatively high transparency (for the light beam "L"), e.g. higher than a material forming the light-absorbing layer 12. Advantageously the relatively transparent thermal insulating can allow the light beam "L" to pass through from the transparent carrier 11 to illuminate and heat the light-absorbing layer 12, while preventing or at least lowering heat transfer from the light-absorbing layer 12 back to the transparent carrier 11. In this way, heat may be more efficiently transferred to the melt layer 13. In one embodiment, e.g. as shown, the thermal insulating layer 11i is segmented between the components 15. This may further lower heat transfer back to the transparent carrier 11 and/or lower heat transfer between neighbouring components. It will be understood that while the thermal insulating layer 11i is shown here with a specific embodiment, the layer can also be applied in combination with any of the other embodiments as described herein (segmented or not).

Figure 5B:
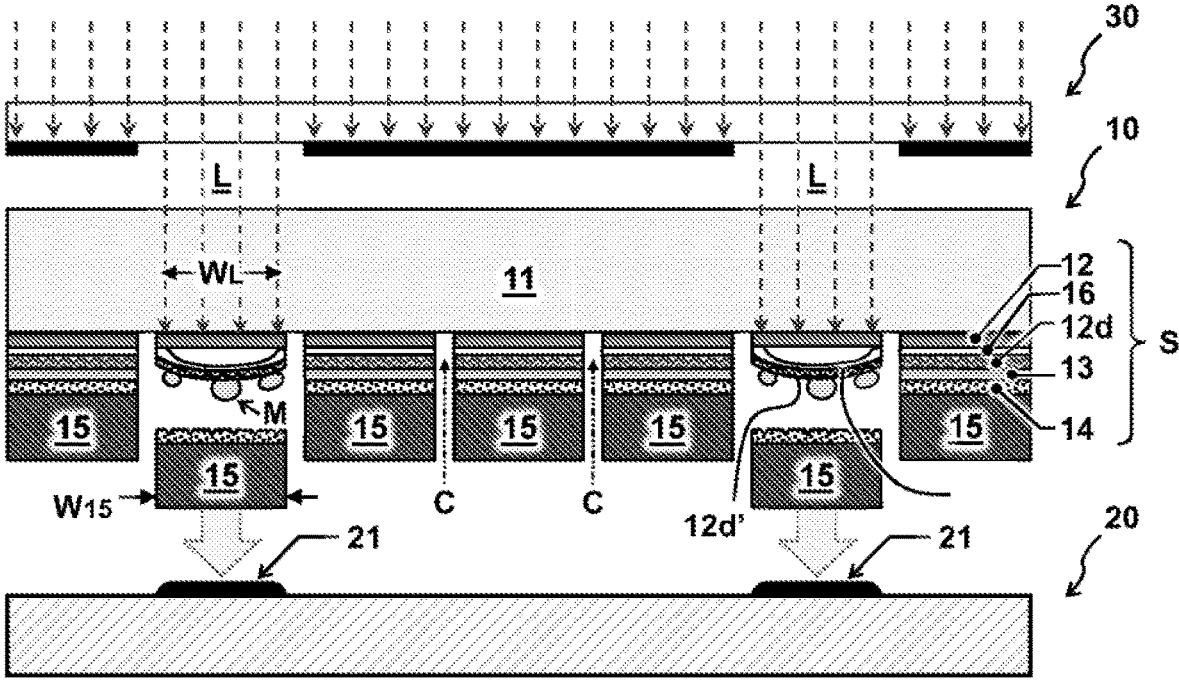

FIG. 5B illustrate an embodiment wherein the donor substrate 10, e.g. stack "S", comprises a de-wetting layer 12d between the decomposition layer 16 and the melt layer 13. Generally, dewetting describes the process of retraction of a fluid from a surface it was forced to cover, in this case retraction of the melted material "M" of the melt layer 13 from the de-wetting layer 12d. One factor describing the spontaneous spreading and dewetting for a drop of liquid on a surface solid (e.g. with ambient gas), is the so-called spreading coefficient "S". When S>0 spontaneous spreading occurs, and if S<0, partial wetting or dewetting may be observed. Alternatively, or additionally, wetting and dewetting can be described by the equilibrium contact angle θc of a drop of liquid on the surface. When the surface is more wetting, the contact angle may be smaller; and when the surface is more de-wetting, the contact angle may be smaller. In some embodiments, the de-wetting layer 12d is applied to promote de-wetting of the melted material "M" of the melt layer 13 compared to the light-absorbing layer 12. For example, the spreading coefficient for the melted material "M" on the de-wetting layer 12d is lower and/or the equilibrium contact angle is higher, than for the melted material "M" on the light-absorbing layer 12. The controlled de-wetting may have various advantages such as retracting the melted material "M" which can improve release adhesion of a select component 15. The retraction can also help push the select component by local accumulation of material. Preferably, the de-wetting layer 12d has a higher melting temperature than that of the melt layer 13 and potentially also higher or comparable that of the decomposition layer 16. Preferably, the de-wetting layer 12d has a relatively good heat conductivity and/or is relatively thin, so that heat transfer from the light-absorbing layer 12 to the melt layer 13 is minimally affected, or not affected at all. For example, the de-wetting layer 12d may have the same or similar, or higher, heat conductivity compared to the light-absorbing layer 12. In some embodiments, the de-wetting layer 12d is formed by a (thin) coating, e.g. monolayer, on the decomposition layer 16. Accordingly, the heated light-absorbing layer 12 can be in thermal contact with the melt layer 13 via the decomposition layer 16 and the de-wetting layer 12d. The decomposition layer 16 and the de-wetting layer 12d may be combined into a single functional layer in case the material thereof meets the requirements of both these layers. For example, the possibility of using aluminium oxide or silicon oxide has been suggested above as candidates for a layer providing both functionalities of layers 16 and 12d above.

Figure 6:
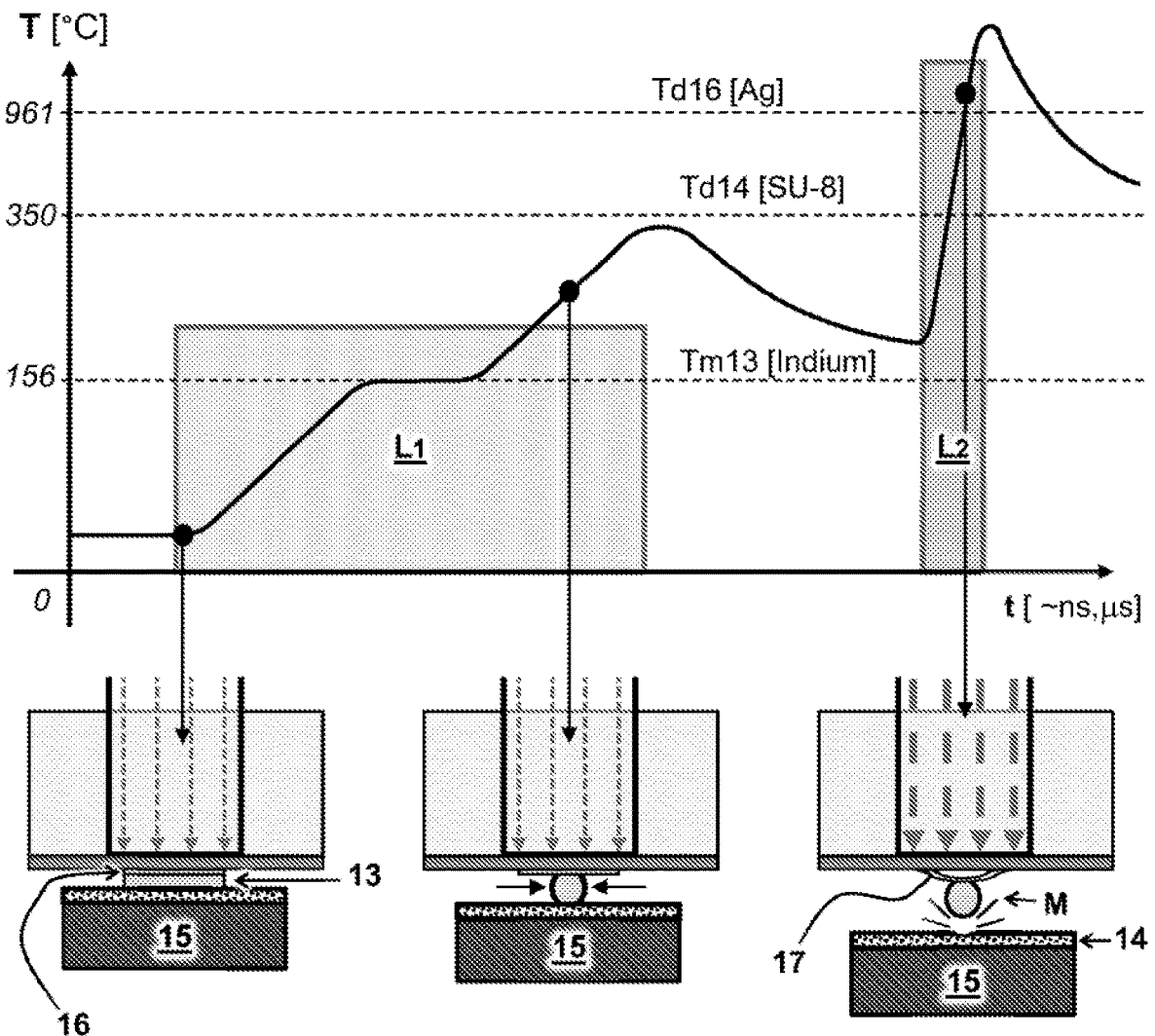
FIG. 6 illustrates a sequence of releasing a component by multiple light pulses.

FIG. 6 illustrates releasing a component 15 from a donor substrate 10 by illuminating the release stack S, as described in the embodiments above, with multiple light pulses. Some embodiment comprise illuminating a respective area of the light-absorbing layer forming part of a respective release stack holding a respective component, with a first light pulse L1 to heat the respective part of the light-absorbing layer and initiate and/or complete melting the adjacent part of the melt layer. Other or further embodiments comprise illuminating the respective area of the light-absorbing layer with a second light pulse L2 to further promote release of the component 15 from the partially or fully melted material "M" of the melt layer 13. In one embodiment, the first light pulse L1 is relatively long, e.g. sufficiently long to completely melt the melt layer 13, as illustrated. In another or further embodiment, the melt layer 13 may be at least partially melted by the first light pulse L1. In another or further embodiment, the second light pulse L2 is relatively short and/or has relatively high power compared to the first light pulse L1. In some embodiments, the first light pulse L1 causes a relatively gradual melting of the melt layer 13, e.g. with a pulse length of more >1 ns, >10 ns, >100 ns, or even >1 μs. In other or further embodiments, the second light pulse L2 causes a relatively high heat flux, e.g. with a pulse length <1 μs, <100 ns, <10 ns, <1 ns, <100 ps, or even less. For example, the sudden high heat flux may further promote release of the component 15 from the partially or fully melted material "M". For example, second light pulse L2 may result in the forming of bubble 17 by rapidly heating up the decomposition layer 16 above its evaporation temperature Te16. It may further also cause a shockwave in the melted material and/or at least partial disintegration of the adhesive layer 14. In some embodiments, the first light pulse L1 causes contact area reduction of the melted material, e.g. by dewetting on the light-absorbing layer or optional de-wetting layer. In some embodiments, the second light pulse L2 causes a final push to release the component, e.g. by gas generation through decomposition or otherwise. While the present figure shows two separate light pulses, other or further embodiments may achieve a similar effect using a single modulated light pulse, e.g. ramping up power at the end of the pulse. It can also be envisaged to use more than two pulses. In some embodiments, e.g. as shown, the disintegration temperature Td14 of the adhesive layer 14 is higher than the melting temperature Tm13 of the melt layer 13. In other embodiments, e.g. as shown and described with reference to in FIG. 1B, this can also be reversed [e.g. within a certain margin such as Td14>(Tm13−300K)].

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; any of the disclosed devices or portions thereof may be combined together or separated into further portions unless specifically stated otherwise.

The invention claimed is:

1. A method for light induced transfer of components from a donor substrate to an acceptor substrate, wherein the donor substrate comprises:

a transparent carrier configured to carry the components facing the acceptor substrate, and a release stack disposed between the transparent carrier and the components for releasing one or more of the components from the donor substrate onto the acceptor substrate following illumination of the release stack by a light beam through the transparent carrier, wherein the release stack comprises:

a melt layer having a melting temperature, a light-absorbing layer disposed between the transparent carrier and the melt layer, wherein the light-absorbing layer has an absorption coefficient for absorbing the light beam thereby causing the light-absorbing layer to be heated, wherein the heated light-absorbing layer is in thermal contact with the melt layer for conducting its heat to the melt layer thereby causing a temperature of the melt layer to rise above its melting temperature, wherein the light-absorbing layer has a melting temperature which is higher than the melting temperature of the melt layer such that the light-absorbing layer can remain solid while the melt layer is melted by the heat conducted from the light-absorbing layer, a decomposition layer, disposed between the melt layer and the light-absorbing layer, wherein the decomposition layer has an evaporation temperature which is higher than a melting temperature of the melt layer and which is lower than a melting temperature of the light-absorbing layer, and wherein a layer thickness of the decomposition layer is smaller than a layer thickness of the melt layer; and

an adhesive layer adhering the components to the melt layer while the melt layer is solid and releasing adhesion when the melt layer is melted;

the method comprising illuminating an area of the light-absorbing layer, forming a part of the release stack holding a respective component, with a light beam through the transparent carrier to heat a respective part of the light-absorbing layer, wherein the heat is conducted to the melt layer of the release stack via the decomposition layer thereby melting the melt layer and heating the decomposition layer while the respective part of the light-absorbing layer remains solid, wherein the melting of the melt layer causes a loss of adhesion between the melt layer and a respective part of the adhesive layer of the release stack adhering the respective components to the melt layer, wherein the loss of adhesion causes release and transfer of the respective component, and wherein the heating of the decomposition layer causes local gas production resulting in bubble-formation in the decomposition layer, thereby accelerating the loss of adhesion between the melt layer and a respective part of the adhesive layer.

2. The method according to claim 1, wherein the decomposition layer has a melting temperature which is higher than the melting temperature of the melt layer.

3. The method according to claim 1, wherein the layer thickness of the decomposition layer is smaller than 20% of the thickness of the melt layer.

4. The method according to claim 3, wherein the layer thickness of the decomposition layer is smaller than 20% of the thickness of the melt layer.

5. The method according to claim 4, wherein the layer thickness of the decomposition layer is smaller than 10% of the thickness of the melt layer.

6. The method according to claim 1, wherein the layer thickness of the decomposition layer is between 5 nanometers and 100 nanometers.

7. The method according to claim 6, wherein the layer thickness of the decomposition layer is between 5 nanometers and 50 nanometers.

8. The method according to claim 1, wherein one or more of:

the melt layer comprises a first metal layer;
the light-absorbing layer comprises a second metal layer; and/or
the decomposition layer comprises a third metal layer.

9. The method according to claim 1, wherein at least one of:

the decomposition layer has an evaporation temperature lower than an evaporation temperature of the melt layer; or
the decomposition layer has an evaporation temperature of at most 15% higher than an evaporation temperature of the melt layer.

10. The method according to claim 1, wherein the light beam illuminating the release stack is configured to:

cause a temperature of the melt layer to rise above its melting temperature but remain below its evaporation temperature, and further,
after the temperature of the melt layer has risen above the melting temperature, to cause a temperature of the decomposition layer to rise above its evaporation temperature.

11. The method according to claim 1, wherein the adhesive layer has a disintegration temperature that is above the melting temperature of the melt layer, or higher than three hundred degrees Kelvin below the melting temperature of the melt layer.

12. The method according to claim 1, wherein at least one of the adhesive layer, the melt layer, the decomposition layer and the light-absorbing layer is segmented between the components.

13. The method according to claim 1, wherein an area of the melt layer holding a respective component is smaller than an area of the respective component by at least a factor of two.

14. The method according to claim 1, wherein a mask is aligned with the donor substrate, wherein the mask comprises a set of mask windows aligned with a subset of the components on the donor substrate, wherein, a set of light spots is used to sequentially or simultaneously illuminate the set of mask windows for release of respective components, wherein a respective light spot is larger than a respective mask window being illuminated, with a light spot FWHM diameter larger than a width of the mask window by a least a factor of two.

15. The method according to claim 1, wherein the light-absorbing layer is configured to absorb at least fifty percent of the light beam illuminating the release stack, wherein the light beam is configured to exclusively illuminate a subarea of the light-absorbing layer forming part of a selected release stack holding a selected component, without illuminating immediately adjacent areas of the light-absorbing layer, thereby exclusively releasing the selected component while adjacent components remain attached to the donor substrate.

16. The method according to claim 1, wherein the melting temperature of the melt layer is less than six hundred degrees Kelvin, wherein the melting temperature of the light-absorbing layer is higher than the melting temperature of the melt layer by at least one hundred degrees Kelvin.

17. A donor substrate comprising a transparent carrier carrying components for light induced transfer with a release stack disposed between the transparent carrier and the components for releasing one or more of the components from the donor substrate following illumination of the release stack by a light beam through the transparent carrier, wherein the release stack comprises:

a melt layer having a melting temperature,
a light-absorbing layer disposed between the transparent carrier and the melt layer, wherein the light-absorbing layer has an absorption coefficient for absorbing at least fifty percent of a light beam in a wavelength range between 100-2000 nm and a pulse length less than ten nanoseconds, thereby causing the light-absorbing layer to be heated, wherein the light-absorbing layer is in thermal contact with the melt layer for conducting its heat to the melt layer thereby causing a temperature of the melt layer to rise above its melting temperature, wherein the light-absorbing layer has a melting temperature which is higher than the melting temperature of the melt layer such that the light-absorbing layer can remain solid while the melt layer is melted by the heat conducted from the light-absorbing layer, and
a decomposition layer, disposed between the melt layer and the light-absorbing layer, wherein the decomposition layer has an evaporation temperature which is higher than a melting temperature of the melt layer and which is lower than a melting temperature of the light-absorbing layer, and wherein a layer thickness of the decomposition layer is smaller than a layer thickness of the melt layer;

an adhesive layer adhering the components to the melt layer while the melt layer is solid and releasing adhesion when the melt layer is melted.

18. A system for light induced transfer of components, the system comprising:

the donor substrate according to claim 17 comprising the transparent carrier and the release stack with the light-absorbing layer, the melt layer, and the adhesive layer holding the components, wherein the adhesive layer is segmented between the components;

an acceptor substrate; and a controller and a light source configured to generate a light beam illuminating an area of the light-absorbing layer, forming a part of the release stack holding a respective component, through the transparent carrier to heat a respective part of the light-absorbing layer, wherein the heat is conducted via a decomposition layer to a melt layer of the release stack thereby melting the melt layer and heating the decomposition layer while the respective part of the light-absorbing layer remains solid, wherein the melting of the melt layer causes a loss of adhesion between the melt layer and a respective part of the adhesive layer of the release stack adhering the respective components to the melt layer, wherein the loss of adhesion causes release and transfer of the respective component, and wherein the heating of the decomposition layer causes local gas production resulting in bubble-formation in the decomposition layer, thereby accelerating the loss of adhesion between the melt layer and a respective part of the adhesive layer.

\* \* \* \* \*